United States Patent
Katz et al.

(10) Patent No.: US 8,383,002 B2
(45) Date of Patent: *Feb. 26, 2013

(54) METHOD OF PROCESSING A WORKPIECE IN A PLASMA REACTOR WITH INDEPENDENT WAFER EDGE PROCESS GAS INJECTION

(75) Inventors: Dan Katz, Saratoga, CA (US); David Palagashvili, Mountain View, CA (US); Michael D. Willwerth, Campbell, CA (US); Valentin N. Todorow, Palo Alto, CA (US); Alexander M. Paterson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 121 days.

This patent is subject to a terminal disclaimer.

(21) Appl. No.: 12/954,087

(22) Filed: Nov. 24, 2010

(65) Prior Publication Data

US 2011/0068082 A1  Mar. 24, 2011

Related U.S. Application Data

(62) Division of application No. 11/899,613, filed on Sep. 5, 2007, now Pat. No. 7,879,250.

(51) Int. Cl.
*B44C 1/22* (2006.01)
*C03C 15/00* (2006.01)
*C03C 25/68* (2006.01)
*C23F 1/00* (2006.01)

(52) U.S. Cl. ............ 216/67; 438/710; 156/345.48

(58) Field of Classification Search ............ 216/67; 438/710; 156/345.48
See application file for complete search history.

(56) References Cited

U.S. PATENT DOCUMENTS

| 6,042,687 | A * | 3/2000 | Singh et al. ......... 156/345.33 |
|---|---|---|---|
| 6,179,924 | B1 | 1/2001 | Zhao et al. ............ 118/725 |
| 6,263,829 | B1 | 7/2001 | Schneider et al. ..... 118/723 I |
| 6,269,765 | B1 | 8/2001 | Chu et al. ............ 118/723 I |
| 6,589,352 | B1 | 7/2003 | Yudovsky et al. ....... 118/729 |
| 6,653,237 | B2 | 11/2003 | Deshmukh et al. ....... 438/700 |
| 6,736,931 | B2 | 5/2004 | Collins et al. ....... 156/345.48 |
| 7,832,354 | B2 | 11/2010 | Katz et al. .......... 118/723 R |
| 2006/0060303 | A1 | 3/2006 | Fink et al. ......... 156/345.29 |
| 2006/0175015 | A1 | 8/2006 | Chen et al. ......... 156/345.44 |
| 2007/0193688 | A1 | 8/2007 | Dhindsa et al. ...... 156/345.43 |
| 2009/0057269 | A1 | 3/2009 | Katz et al. ............. 216/67 |

OTHER PUBLICATIONS

Official Action Dated Oct. 19, 2009 Issued in Co-Pending U.S. Appl. No. 11/899,614.
Official Action Dated Mar. 26, 2010 Issued in Co-Pending U.S. Appl. No. 11/899,614.
Official Action Dated May 17, 2010 Issued in Priority U.S. Appl. No. 11/893,613.
Official Action Dated Jul. 22, 2010 Issued in Co-Pending U.S. Appl. No. 11/899,614.
Official Action Dated Oct. 15, 2010 Issued in Priority U.S. Appl. No. 11/899,613.

* cited by examiner

*Primary Examiner* — Robert Culbert
(74) *Attorney, Agent, or Firm* — Robert M. Wallace (57) ABSTRACT

The disclosure concerns a method of processing a workpiece or in a plasma reactor chamber, using independent gas injection at the wafer edge.

6 Claims, 7 Drawing Sheets

METHOD OF PROCESSING A WORKPIECE IN A PLASMA REACTOR WITH INDEPENDENT WAFER EDGE PROCESS GAS INJECTION

CROSS-REFERENCE TO RELATED APPLICATIONS

This application is a divisional of U.S. patent application Ser. No. 11/899,613 filed Sep. 5, 2007 now U.S. Pat. No. 7,879,250 entitled A METHOD OF PROCESSING A WORKPIECE IN A PLASMA REACTOR WITH INDEPENDENT WAFER EDGE PROCESS GAS INJECTION by Dan Katz, et al. and assigned to the present assignee. The above application is hereby incorporated by reference in its entirety.

TECHNICAL FIELD

The disclosure concerns a plasma reactor chamber for processing a workpiece such as a semiconductor wafer to produce integrated circuits. Specifically, the disclosure concerns independent process gas injection at the ceiling and at the wafer edge in such a reactor chamber.

BACKGROUND

In a plasma reactor chamber for etching silicon or polysilicon thin films on a semiconductor wafer, a uniform distribution of etch rate across the wafer is needed. Non-uniform distribution of etch rate across the wafer is indicated by non-uniformity in critical dimension (CD). The critical dimension may be a width of a typical line in the thin film circuit pattern. The CD is less in areas on the wafer surface experiencing a higher etch rate and greater in areas of lower etch rate.

In silicon etch chambers in which the process gas is injected from the ceiling, it has been found that the CD is very small at the wafer edge compared to other areas on the wafer surface. The effect of a small CD is typically confined to the outer or peripheral 1% of the wafer surface. This problem was not solved using conventional techniques. Specifically, etch uniformity can be improved by dividing the gas distribution into independent inner and outer gas injection zones at the ceiling and maximizing uniformity by adjusting the gas flow rates to the inner and outer zones. However, adjustment of the inner and outer gas injection zone flow rates does not solve the problem of small CD at the outer 1% of the wafer surface. Specifically, adjustment of the inner and outer gas injection zone flow rates at the ceiling can produce fairly uniform CD across the wafer, with the exception of a region at the wafer edge whose width is about 1% of the wafer diameter.

Therefore, there is need to independently control the CD at the outer 1% of the wafer edge without detracting from etch rate distribution uniformity achieved for the other areas of the wafer.

SUMMARY

A method is provided for processing a workpiece in a plasma reactor. The method comprises placing the workpiece on a workpiece support in chamber of the plasma reactor and introducing a first process gas through a workpiece support process gas injector adjacent and surrounding the peripheral edge of the workpiece. The method further comprises coupling plasma RF source power into the plasma reactor to generate a plasma in the plasma reactor chamber. In one embodiment, the method may further comprise introducing a second process gas into the chamber through a ceiling process gas disperser located at a ceiling of the chamber that overlies the workpiece support. The gas flow rate through the workpiece support process gas injector is controlled independently of the gas flow rate through the ceiling process gas disperser.

In one embodiment, the method further comprises adjusting gas flow rate through the ceiling process gas disperser to optimize process uniformity over a major portion of the workpiece. The method may further comprise adjusting process gas flow rate through the workpiece support process gas injector to optimize processing at a peripheral zone of the workpiece.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

Figure 1:
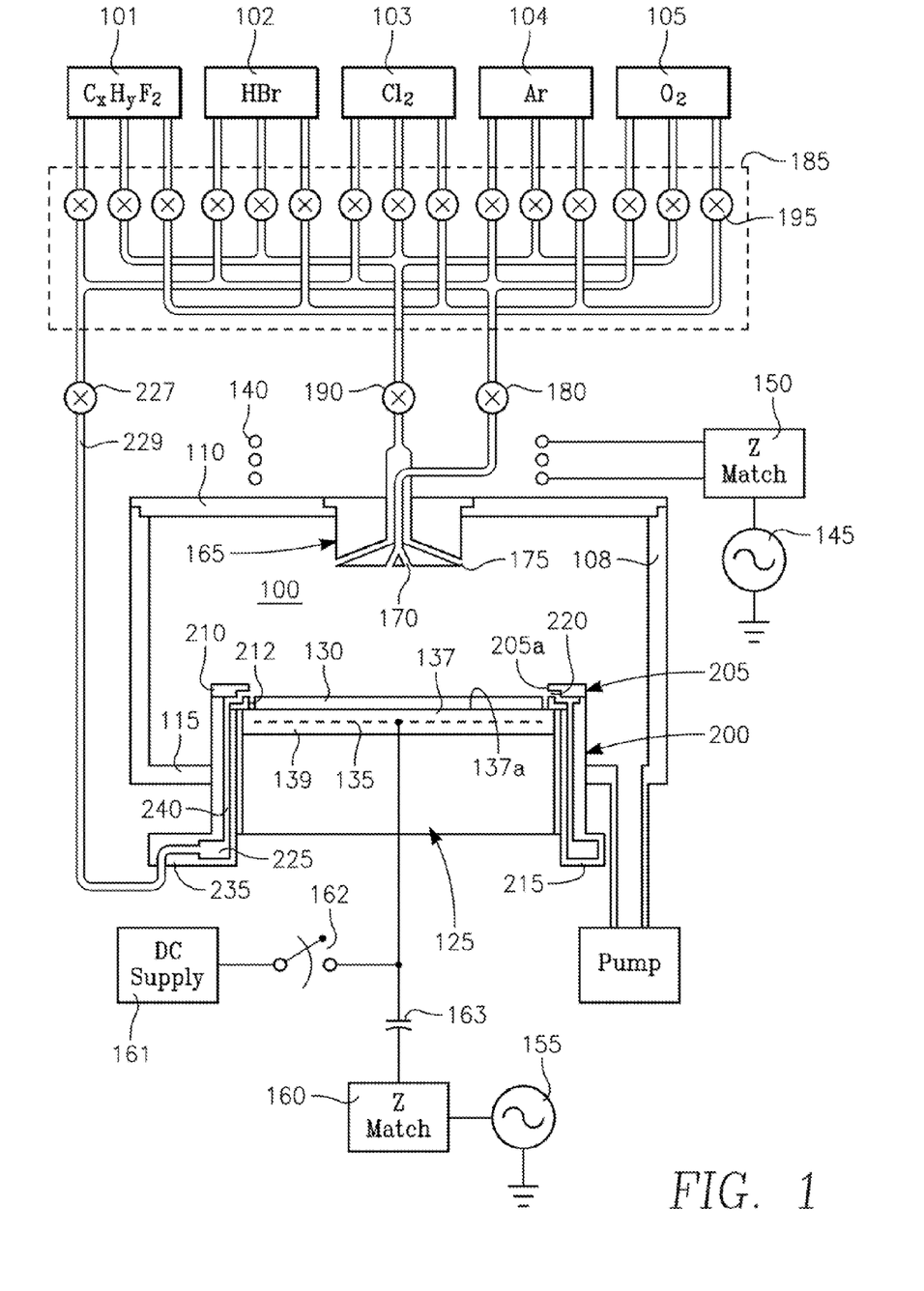
FIG. 1 depicts a plasma reactor in accordance with one embodiment.

Referring to FIG. 1, a plasma reactor includes a vacuum chamber 100 enclosed by a cylindrical side wall 108, a ceiling 110 and a floor 115. A wafer support 125 supports a semiconductor wafer 130 during wafer processing. The wafer support 125 includes a cathode electrode 135 that also serves as an electrostatic chuck (ESC) electrode. The support 125 includes an insulating layer 137 separating the electrode 135 from the wafer 130 and an insulating layer 139 separating the electrode 135 from underlying components of the wafer support 125. The upper insulating layer 137 has a top wafer-supporting surface 137a. The reactor further includes an inductively coupled source power applicator or coil antenna 140 overlying the ceiling 110. An RF plasma source power generator 145 is coupled to the coil antenna 140 through an RF impedance match 150. An RF plasma bias power generator 155 is coupled to the cathode electrode 135 through an RF impedance match 160. A D.C. chucking voltage supply 161 is connected through a control switch 162 to the ESC electrode 135. An isolation capacitor 163 blocks D.C. current from the supply 161 from the RF bias power generator 155.

Process gas is delivered into the chamber interior by a gas distribution injector 165 on the ceiling 110. The injector 165 consists of an inner zone injector 170 and an outer zone injector 175. Each one of the inner zone injector 170 and the outer zone injector 175 may be implemented with plural injection holes or, alternatively, as a slit. The inner zone injector 170 is oriented to direct process gas toward a center region of the chamber. The outer zone injector 175 is oriented to direct process gas toward a peripheral region of the chamber. The inner zone injector 170 is coupled through a valve 180 to a gas distribution panel 185. The outer zone injector 175 is coupled through a valve 190 to the gas distribution panel 185. Different process gas supplies 101, 102, 103, 104, 105 supply different process gases to the gas distribution panel 185. As indicated in the drawing of FIG. 1, in one embodiment, each gas supply may be connected separately to different ones of the inner and outer valves 180, 190 through independent valves 195. In the embodiment of FIG. 1, the gas supply 101 contains a fluoro-hydrocarbon gas such as $CH_2F_2$ or $CHF_3$, the gas supply 102 contains hydrogen bromide gas, the gas supply 103 contains chlorine gas, the gas supply 104 contains argon gas and the gas supply 105 contains oxygen gas. The gases referred to here are examples. Any suitable process gas may be used.

The wafer support 125 is surrounded by a ring-shaped cathode liner 200. The cathode liner 200 may be formed of a process-compatible material such as quartz, for example. A process ring 205 covers the top of the cathode liner 200 and covers a peripheral portion of the wafer support surface 137a. The process ring 205 is formed of a process-compatible material such as quartz. The wafer support 125 may contain materials such as metal that are incompatible with plasma processing, and liner 200 and the ring 205 isolate the wafer support 125 from the plasma. The radially inner edge 205a of the process ring 205 is adjacent the edge of the wafer 130. In one embodiment, the process ring may provide improved distribution of RF electrical fields.

A silicon or polysilicon etch process employs silicon etch gases such as HBr and $Cl_2$ to etch silicon material and employs a polymerizing species such as $CH_2F_2$ or $CHF_3$ to improve etch profile. The polymer deposits on sidewalls of deep aspect ratio openings in a polymer deposition reaction that competes with the etch reaction.

The reactor of FIG. 1 can have a problem of poor critical dimension (CD) control at the wafer edge. Typically, the CD is the width a selected line in the circuit pattern. The CD tends to be smaller at the wafer edge than elsewhere on the wafer 130. The problem of a small CD tends to occur in an annular zone at the edge of the wafer 130 whose width (extending inwardly from the wafer edge) is about 1% of the wafer diameter. (This narrow zone will hereafter be referred to as the wafer edge zone 130a shown in FIG. 5, which is discussed later in this specification.) Over the remainder of the wafer 130, such problems are minimized or prevented by adjusting the valves 180 and 190 to obtain an optimum, ratio of process gas flow rates to the inner and outer gas ceiling injectors 170, 175. However, such an optimum adjustment does not solve the problem of poor CD control at the wafer edge zone 130a. The small CD at the wafer edge zone 130a is indicative of a higher etch rate at the wafer edge zone than elsewhere.

We have discovered that the gas flow velocity over the wafer edge zone 130a is extremely low relative to gas flow velocity over most other portions of the wafer. For instance, in certain applications, while gas flow velocity over the majority of the wafer surface is between about 10 and 20 meters per second, gas flow over the wafer edge zone approaches zero. If gas flow over the wafer edge zone is thus stagnant, then the gas residency time over the wafer edge zone is extremely high, yielding correspondingly high dissociation of the process gas species. Such high dissociation can increase the population at the wafer edge zone of highly reactive species. Such highly reactive species may include radicals or neutrals that either (a) etch extremely fast or (b) inhibit polymer deposition. A highly reactive etch species generated by such dissociation may include atomic HBr and/or atomic $Cl_2$, for example. The result is a higher etch rate and a correspondingly smaller CD.

In one embodiment, a new gas is injected at the wafer edge to address the non-uniform etch rate at the wafer edge. The new gas may be an inert gas such as argon, for example. In one embodiment, the injection of the new gas increases the gas flow velocity over the wafer edge zone and decreases process gas residency time over the wafer edge zone. The decrease in residency time reduces the population over the wafer edge zone of highly reactive species such as radicals or neutrals. The velocity or flow rate at which the new gas is injected at the wafer edge can be sufficiently low to avoid influencing the etch rate beyond the narrow wafer edge zone. Typically, the wafer edge zone is about 3 mm wide.

In one embodiment, a polymerizing gas is injected at the wafer edge to address the non-uniform etch rate at the wafer edge. The polymerizing gas may be $CH_2F_2$ or $CHF_3$, for example. The addition of the polymerizing species increases the polymer deposition rate the wafer edge zone, which decreases the etch rate. The velocity or flow rate at which the polymerizing species gas is injected at the wafer edge can be sufficiently low to avoid influencing the etch rate beyond the narrow wafer edge zone. Typically, the wafer edge zone is about 3 mm wide.

In one embodiment, the process ring 205 is divided into an upper process ring 210 and a lower process ring 212, leaving a narrow circular slit 220 between them facing (almost touching) the edge of the wafer 130. The circular slit 220 is separated from the edge of the wafer by a very small distance in the range of 0.6 mm to 3 mm, e.g., about 1% of the wafer diameter. A desired gas (such as an inert gas or a polymerizing species gas) is supplied so as to be ejected from the circular slit 220 radially inwardly and directly at the wafer edge. This new gas or polymerizing species gas may be supplied from the gas distribution panel 185.

In one embodiment, an annular gas plenum 225 is provided at the bottom of the cathode liner 200. A cathode gas flow control valve 227 controls gas flow from the gas distribution panel 185 to the plenum 225 through a conduit 229. Gas is conducted from the plenum 225 to the circular slit 220 at the wafer edge by vertical passages 240 inside the cathode liner 200.

Figure 2:
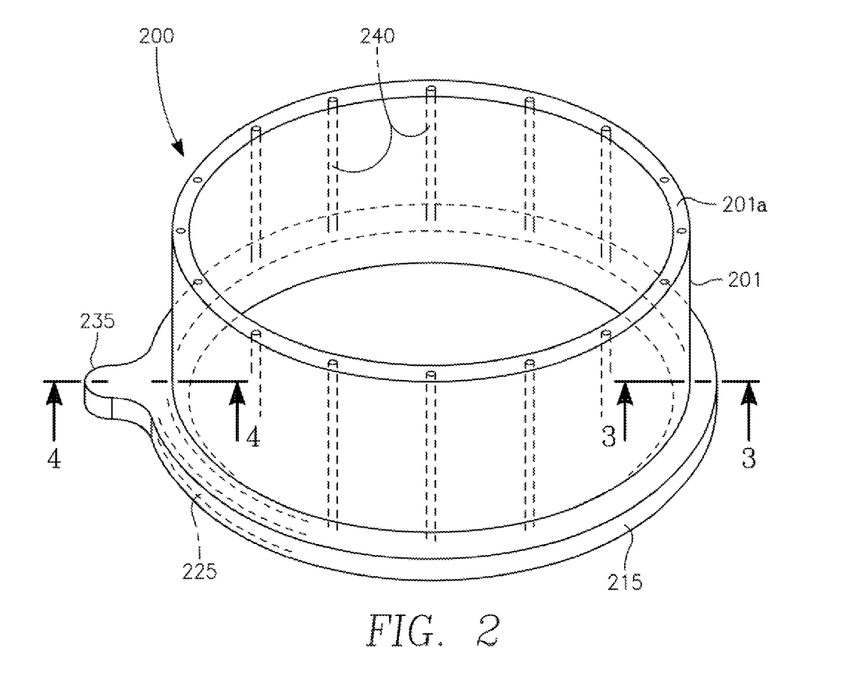
FIG. 2 illustrates internal structural features of a cathode liner of the reactor of FIG. 1.
Figure 3:
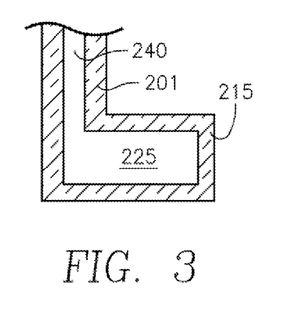
FIG. 3 is a cross-sectional view taken along lines 3-3 of FIG. 2.
Figure 4:
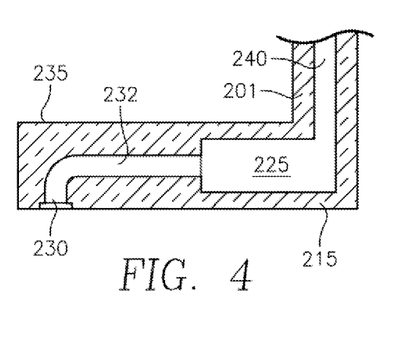
FIG. 4 is a cross-sectional view taken along lines 4-4 of FIG. 2.
Figure 5:
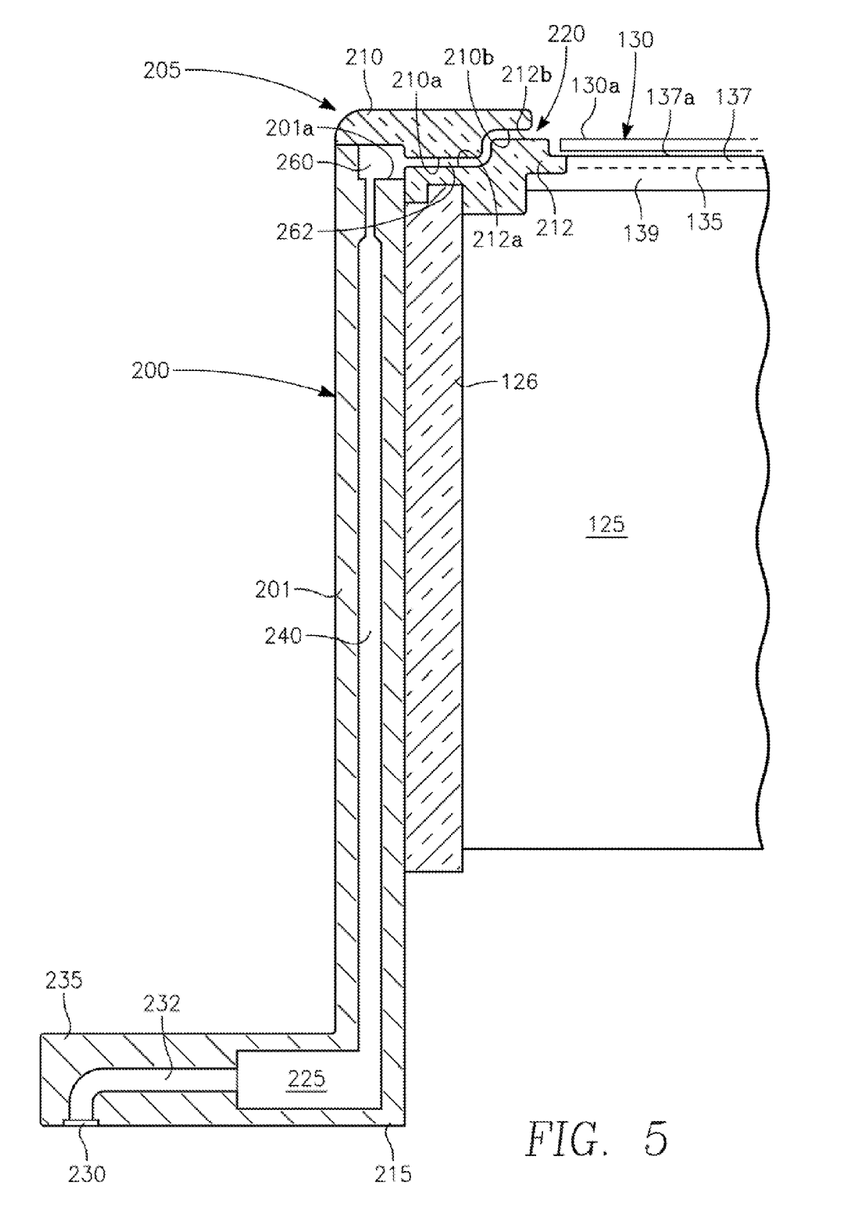
FIG. 5 is a detailed view of a portion of the process rings and cathode liner of one embodiment.

FIG. 2 illustrates an exemplary internal structure of the cathode liner 200. The cathode liner 200 was described with reference to FIG. 1 as being formed of an insulator such as quartz. In the embodiment of FIG. 2, the cathode liner 200 is formed of metal, and, as shown in FIG. 5, a quartz liner 126 separates the metal cathode liner 200 from the wafer support 125. The cathode liner 200 includes a cylindrical wall 201 having an annular top surface 201a. An annular base 215 supports the cylindrical wall 201. A shoulder 235 extends in the radially outward direction from the base 215 and houses a gas supply inlet 230. The plenum 225 shown in FIG. 1 is formed within the cathode ring annular base 215 of FIG. 2, as depicted in the cross-sectional view of FIG. 3. An internal channel 232 extends radially through the shoulder 235 and is coupled at one end to the gas supply inlet 230 and is coupled at an opposite end to the plenum 225, as depicted in the cross-sectional view of FIG. 4. As shown in FIG. 2, the vertical passages 240 extend axially through the cylindrical wall 201 and are spaced azimuthally around the cylindrical wall 201. The bottom end of each vertical passage 240 is coupled to the plenum 225 and the top end of each vertical passage 240 opens at the annular top surface 201a of the cylindrical wall 201. In one embodiment, the cylindrical wall 201 is about 0.25 inch thick, and each of the vertical passages 240 is an axial 0.05 inch hole within the cylindrical wall 201.

In the embodiment of FIG. 1, the cylindrical wall 201 supports the lower process ring 212 and the upper process ring 210 is supported on the lower process ring 215.

As shown in FIG. 5, the interior quartz liner 126 surrounds the workpiece support 125 and is surrounded by the cathode liner cylindrical wall 201. As shown in FIG. 5, the interior liner 126 supports the lower process ring 212, while the cathode liner cylindrical wall 201 supports the upper process ring 210. An annular gas feed chamber 260 is bounded by the cylindrical wall top surface 201a, the upper process ring and the lower process ring 212. An annular feed passage 262 is formed as a gap between the upper and lower process rings 210 and 212. An outer annular protrusion 210a in the bottom surface of the upper process ring 210 faces an outer annular recess 212a in the top surface of the lower process ring 212. An inner annular recess 210b is provided in the bottom surface of the upper process ring 210. The inner annular recess 210b faces a raised shoulder 212b of the lower process ring 212 to form the gas injection slit 220. The protrusion 210a, the recess 212a, the recess 210b and the shoulder 212b provide the feed passage 262 with a meandering path, as shown in FIG. 5. Gas supplied through the valve 227 of FIG. 1 flows to the cathode or wafer support 125 and enters the inlet 230 shown in FIG. 4, and then flows through the internal channel 232 to the plenum 225. From the plenum 225, the gas flows up through the vertical channels 240 into the feed chamber 260 of FIG. 5, and then flows through the feed passage 262 into the injection slit 220.

Figure 6:
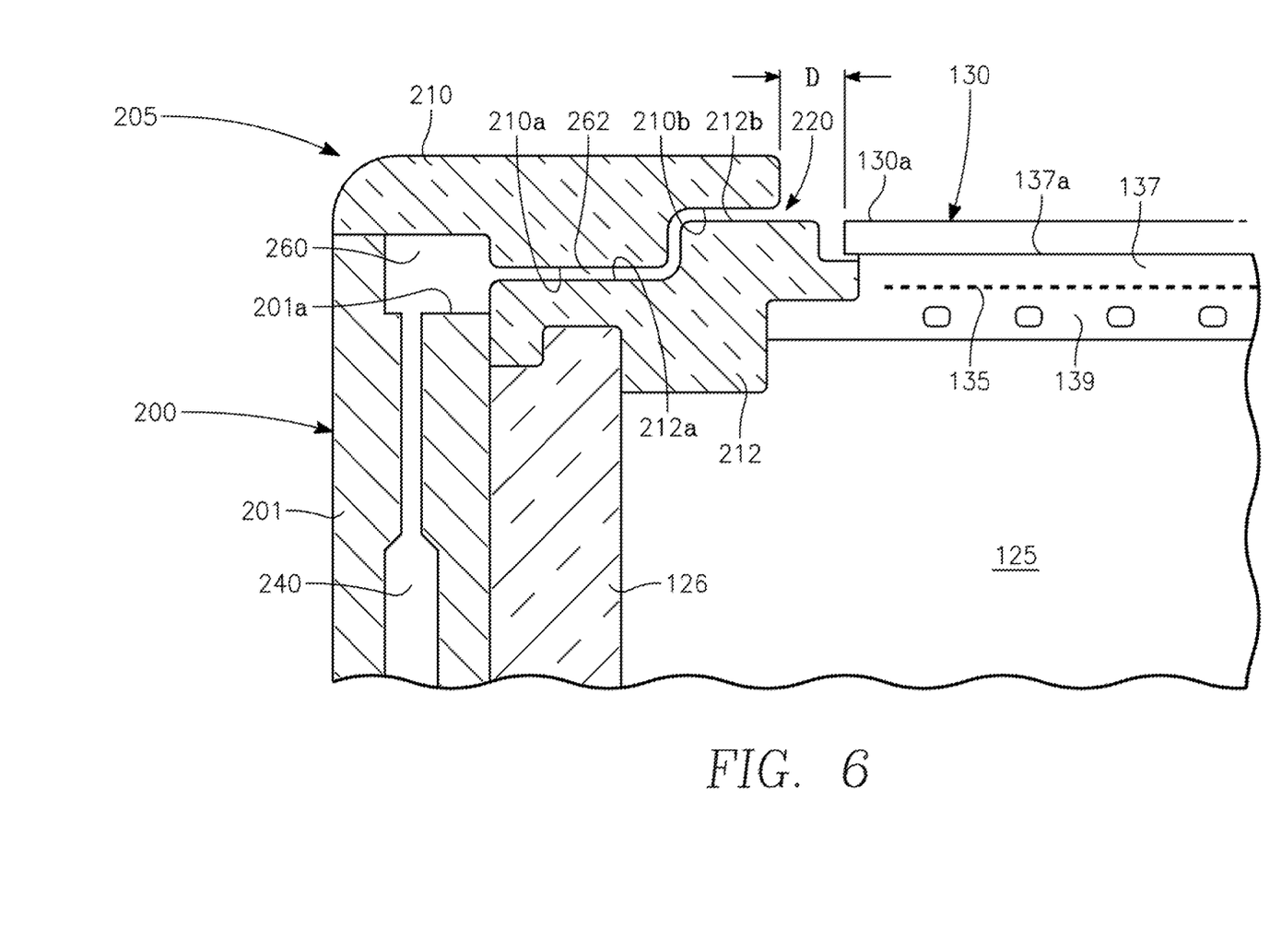
FIG. 6 is a side view corresponding to FIG. 5.

As shown in the side view of FIG. 6, the end or exit port of the injection slit 220 is within a very short distance D of the edge of the wafer 130, where D is on the order of between 0.6 mm to 3 mm. Given such a short distance, the effect of gas flow from the injection slit 220 may be highly localized so as to not affect processing beyond the 3 mm-wide wafer edge zone 130a. Such localization may be realized by establishing a very low gas flow rate within the injection slit 220. For example, the gas flow rate through the valve 227 (to the wafer edge injection slit 220) may be between 1% and 10% of the gas flow rate through the valves 180 and 190. In this way, the gas flowing out of the injection slit 220 affects processing (e.g., etch rate) only in the narrow wafer edge zone 130a, without affecting processing on the remaining portion of the wafer 130.

Figure 7:
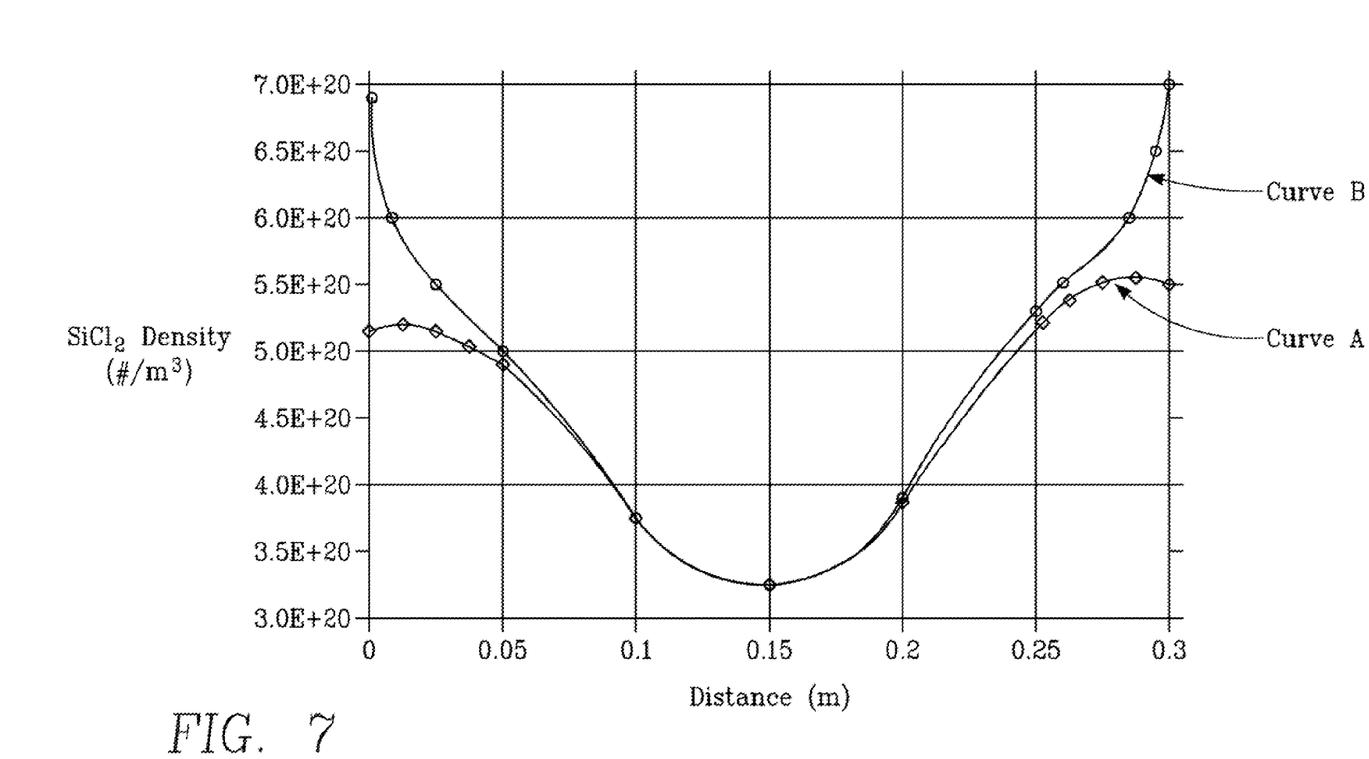
FIG. 7 is a graph depicting radial distribution of $SiCl_2$ in the reactor of FIG. 1 with and without gas flow through the wafer edge injector slot.

FIG. 7 is a graph depicting the density of $SiCl_2$ over the wafer surface as a function of radial position in a process in which a polymerizing gas, such as $CH_2F_2$ or $CHF_3$ is introduced through the wafer edge injection slit 220 of FIGS. 1-6, while an etch process gas such as HBr and $Cl_2$ is introduced through the ceiling injectors 170, 175. The density of $SiCl_2$ is an indicator of the degree of polymerization in such a process. The graph in FIG. 7 shows that, in the absence of any gas flow from the injection slit 220, polymerization is relatively depressed at the wafer edge (curve A). With the polymerizing gas being supplied through the injection slit 220, the degree of polymerization at the wafer edge increases significantly (curve B). The polymerization gas flow through the wafer edge injection slit 220 is limited to a low rate. This limitation of the injection slit flow rate confines the increase in polymerization to the outer 1% of the wafer diameter, the wafer edge zone. In one example, the etch process gas flow rate through the ceiling injector nozzles 170, 175 was about 150 sccm while the polymerization gas flow through the wafer edge injector slot 220 was about 5 sccm.

Figure 8:
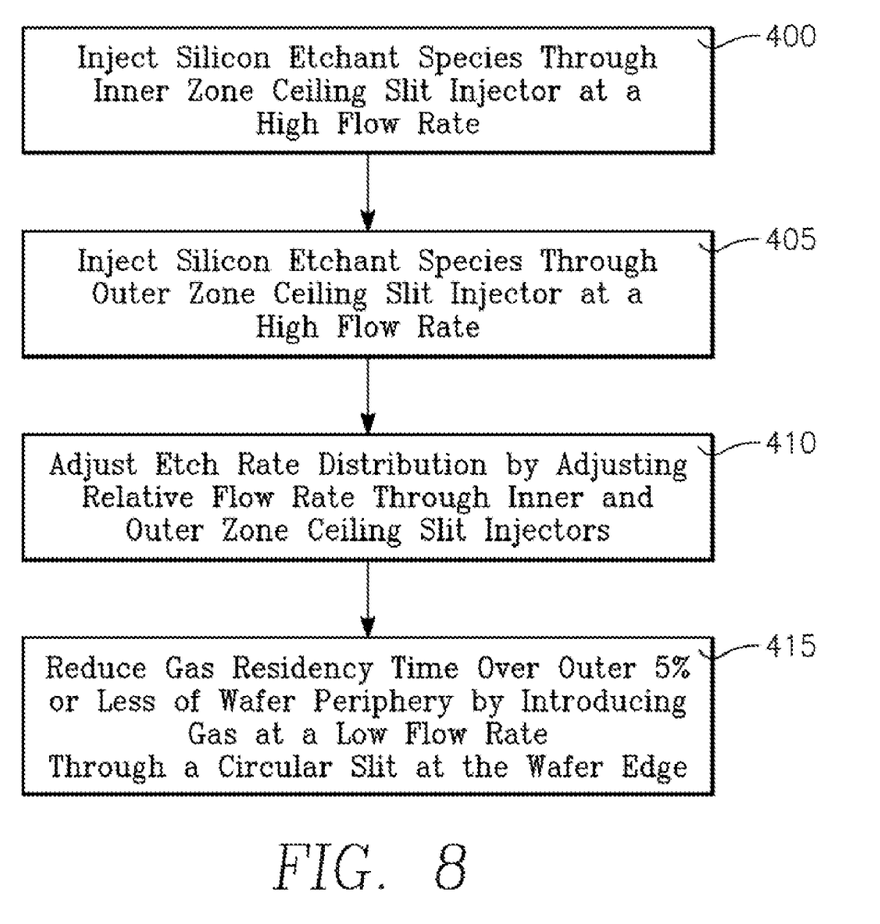
FIG. 8 illustrates a method in accordance with one embodiment.

FIG. 8 illustrates an exemplary method of operating the plasma reactor of FIGS. 1-6 so as to increase CD in the wafer edge zone. A silicon etchant species gas, such as HBr and $Cl_2$, is injected through the inner zone ceiling injector 170 at a first gas flow rate (block 400 of FIG. 8), and through the outer zone ceiling injector 175 at a second gas flow rate (block 405 of FIG. 8). Gas flow through the inner and outer zone ceiling injectors 170, 175 is sufficient to attain a desired average etch rate across the wafer surface. Etch rate distribution is adjusted over all but the peripheral 1% of the wafer surface by independently adjusting the gas flow rates through the inner and outer ceiling injectors 170, 175 until etch rate distribution uniformity is optimized (block 410 of FIG. 8). This typically leaves the etch rate too high (or the CD too low) in the wafer edge zone or the outer 1% of the wafer surface. Etch rate is adjusted downwardly (or CD is adjusted upwardly) in the wafer edge zone by reducing gas residency time over the wafer edge zone (exclusively) in order to reduce dissociation over the wafer edge zone. In one embodiment, reducing the gas residency time over the wafer edge zone is done by flowing through the wafer edge injection slit 220 a suitable gas, such as an inert gas or oxygen, to stir up gas flow over the wafer edge (block 415 of FIG. 8). The increase in gas flow, or decrease in gas residency time, is confined to the wafer edge zone by limiting the gas flow rate through the wafer edge injector slit to a small flow rate. This small flow rate is chosen to attain the most uniform CD distribution, which may be affected by the choice of process gas species, and may be in the range of 1-20 sccm, for example.

Figure 9:
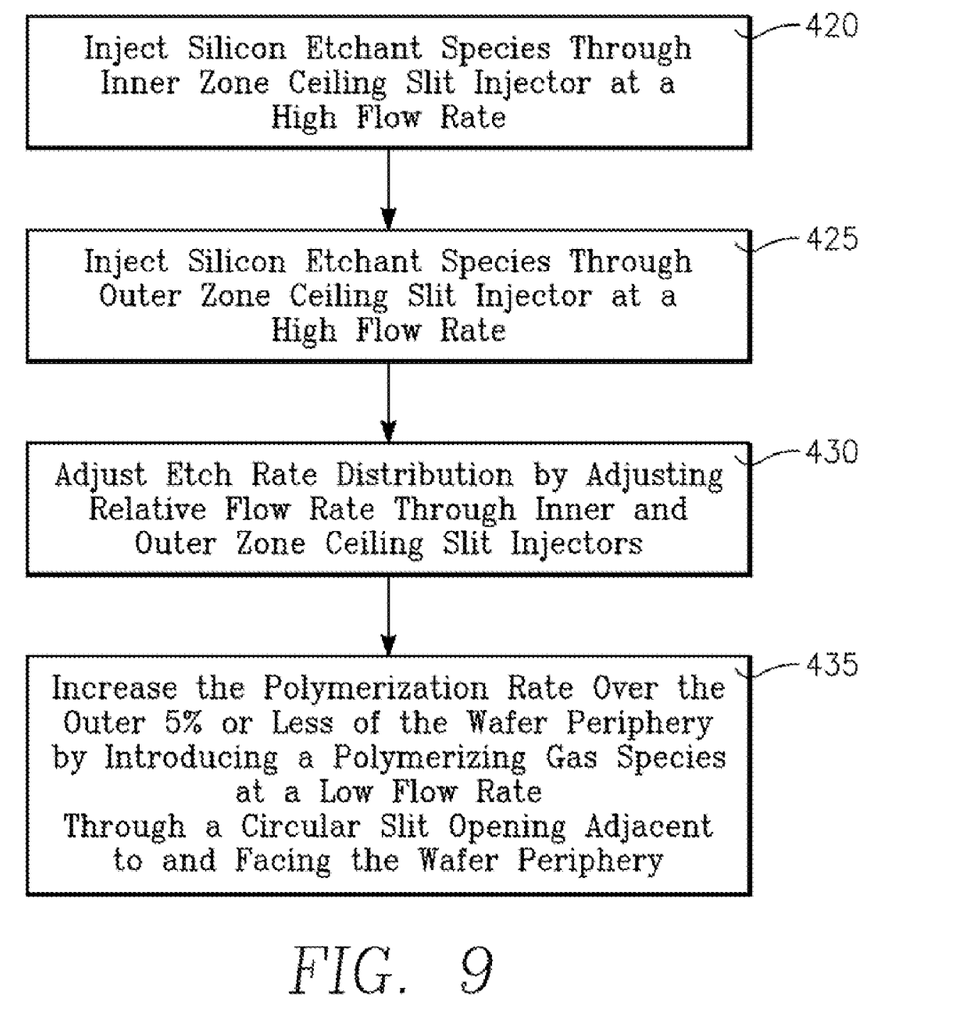
FIG. 9 illustrates a method in accordance with another embodiment.

FIG. 9 illustrates another exemplary method of operating the plasma reactor of FIGS. 1-6 so as to increase CD in the wafer edge zone. A silicon etchant species gas, such as HBr and $Cl_2$, is injected through the inner zone ceiling injector 170 at a first gas flow rate (block 420 of FIG. 9), and through the outer zone ceiling injector 175 at a second gas flow rate (block 425 of FIG. 9). Gas flow through the inner and outer zone ceiling injectors 170, 175 is sufficient to attain a desired average etch rate across the wafer surface. Etch rate distribution is adjusted over all but the peripheral 1% of the wafer surface by independently adjusting the gas flow rates through the inner and outer ceiling injectors 170, 175 until etch rate distribution uniformity is optimized (block 430 of FIG. 9). This typically leaves the etch rate too high (or the CD too low) in the wafer edge zone or the outer 1% of the wafer surface. Etch rate is adjusted downwardly (or CD is adjusted upwardly) in the wafer edge zone by increasing polymerization over the wafer edge zone (exclusively) in order to reduce etch rate over the wafer edge zone. In one embodiment, increasing polymerization over the wafer edge zone is done by flowing through the wafer edge injection slit 220 a polymerization gas, such as $CH_2F_2$ or $CHF_3$ (block 435 of FIG. 9). The resulting increase in polymer deposition rate increases the CD. This increase is confined to the wafer edge zone by limiting the gas flow rate through the wafer edge injector slit to a small flow rate. This small flow rate is chosen to attain the most uniform CD distribution, which may be affected by the choice of process gas species, and may be in the range of 1-20 sccm, for example.

In either one of the methods of FIG. 8 or 9, further optimization is achieved by adjusting the gas flow rates through the ceiling injectors 170 and 175 and/or adjusting the gas flow rates through the wafer edge slit 220. For example, the etchant gas flow through the ceiling injectors 170, 175 may be reduced while increasing inert or polymerization gas flow through the wafer edge slit 220 to further increase CD at the wafer edge zone. However, the flow rate through the wafer edge slit can be sufficiently low in order to confine the effects to the wafer edge zone. However, the etchant gas flow rate through the ceiling injectors 170, 175 may be decreased as low as desired (e.g., to zero). And conversely, the etchant gas flow through the ceiling injectors 170, 175 may be increased while decreasing inert or polymerization gas flow through the wafer edge slit 220 to decrease CD at the wafer edge zone.

While the invention has been described with reference to embodiments in which a selected gas is injected next to wafer edge through a continuous slit injector, the injector at the wafer edge may assume other forms, such as an array or succession of many gas injection orifices around the wafer edge.

While the foregoing is directed to embodiments of the invention, other and further embodiments of the invention may be devised without departing from the basic scope thereof, and the scope thereof is determined by the claims that follow.

What is claimed is:

1. A method of performing a plasma etch process on a workpiece surface of a workpiece comprising a surface material to be etched, comprising:

placing the workpiece on a workpiece support in a chamber of the plasma reactor;

introducing through a ceiling gas disperser a first process gas comprising an etchant species capable of causing etching of said surface material in a plasma;

generating a plasma in said chamber by coupling RF power into said chamber;

controlling etch rate distribution across said workpiece surface by adjusting flow rate of said first process gas through said ceiling gas disperser;

reducing etch rate at an edge periphery of said workpiece surface relative to etch rate across a remainder of said workpiece surface by injecting a polymerizing gas through a workpiece support gas disperser provided on said workpiece support and facing said edge periphery, said workpiece support gas disperser defining a polymerizing gas injection pattern directed toward said edge periphery of said workpiece surface and confined generally to said edge periphery;

providing a slit injector comprising a thin opening extending circumferentially around said edge periphery of said workpiece surface and extending from a lower boundary coplanar with said workpiece surface to an upper boundary above a plane of said workpiece surface; and wherein said injecting a polymerizing as comprises flowing said polymerizing gas from a gas supply passage supported on said workpiece support and ejecting said polymerizing as through said slit injector along a radial direction parallel to said workpiece surface.

2. The method of claim 1 wherein said surface material to be etched comprises one of silicon or polysilicon, said first process gas comprises one of HBr or $Cl_2$, and said polymerizing gas comprises one of $CH_2F_2$ or $CHF_3$.

3. The method of claim 1 wherein said edge periphery is limited to on the order of 1% of an outer portion of a diameter of said workpiece surface.

4. The method of claim 3 further comprising limiting gas flow rate through said workpiece support gas disperser to confine the effect of the polymerizing gas to said edge periphery of said workpiece surface.

5. The method of claim 1 wherein injecting a polymerizing gas through a workpiece support gas disperser comprises supplying said polymerizing gas through gas flow channels inside a portion of said workpiece support.

6. The method of claim 5 wherein injecting a polymerizing gas further comprises conducting polymerizing gas received from said gas flow channels through a process ring on said workpiece support surrounding said edge periphery of said workpiece surface.

\* \* \* \* \*